United States Patent
Dangelo et al.

(10) Patent No.: US 7,345,495 B2
(45) Date of Patent: Mar. 18, 2008

(54) TEMPERATURE AND VOLTAGE CONTROLLED INTEGRATED CIRCUIT PROCESSES

(75) Inventors: Daniel J. Dangelo, Phoenix, AZ (US); Todd P. Albertson, Chandler, AZ (US); Hon Lee Kon, Georgetown (MY); Jin Pan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 360 days.

(21) Appl. No.: 10/882,905

(22) Filed: Jun. 30, 2004

(65) Prior Publication Data

US 2006/0002161 A1  Jan. 5, 2006

(51) Int. Cl.
*G01R 31/02* (2006.01)
*G01R 31/28* (2006.01)
(52) U.S. Cl. ............................ 324/760; 324/765
(58) Field of Classification Search .............. None
See application file for complete search history.

(56) References Cited

U.S. PATENT DOCUMENTS

| | | | | |
|---|---|---|---|---|
| 4,926,117 A | * | 5/1990 | Nevill | 324/760 |
| 5,093,982 A | * | 3/1992 | Gussman | 29/705 |
| 5,600,257 A | * | 2/1997 | Leas et al. | 324/754 |
| 6,119,255 A | * | 9/2000 | Akram | 714/724 |
| 6,181,146 B1 | * | 1/2001 | Koyama | 324/755 |

* cited by examiner

*Primary Examiner*—Ernest Karlsen
(74) *Attorney, Agent, or Firm*—Blakely, Sokoloff, Taylor & Zafman LLP

(57) ABSTRACT

The present application relates to apparatus and methods for burn-in and other diagnostics performed on integrated circuits. In one embodiment, the invention includes a plurality of sockets, each to hold an integrated circuit (IC), and coupling power to the respective IC from a remote power supply, a plurality of voltage detectors, each coupled to a socket to sense the voltage of the power coupled to the respective IC, and a plurality of remote voltage regulators, each coupled between the power supply and a respective socket, to receive the sensed voltage from the respective voltage detector and to adjust the voltage of the respective coupled power in accordance therewith.

41 Claims, 6 Drawing Sheets

TEMPERATURE AND VOLTAGE CONTROLLED INTEGRATED CIRCUIT PROCESSES

BACKGROUND

1. Field

The present application describes test and burn-in equipment for integrated circuit diagnostics and manufacture and in particular, a system for handling multiple integrated circuits with tight control of operational parameters and instruction execution.

2. Background

Many IC (Integrated circuit) chips, including CPU's (Central Processing Units) and other processors are subjected to diagnostic tests and burn-in before they are put into regular use. The diagnostic and burn-in processes vary with different chips and different manufacturers. Burn-in may involve driving the chip at low clock speeds and elevated temperatures and voltages through a series of test sequences. For complex chips, burn-in can take many hours before the chips are sufficiently tested and conditioned for commercial use. Special equipment is required to maintain the appropriate clock rates, temperatures, voltages and sequences. This equipment may be different for different IC's.

Burn-in equipment technology changes rapidly to keep up with increases in power, speed and density for the IC's upon which they operate. Some new CPU's include multiple cores and caches and need separate voltage supplies for different sections of the chip. Accordingly, burn-in steadily increases in cost and complexity.

In addition, burn-in equipment is replaced or upgraded to meet the demands of new chip designs. In order to reuse existing equipment, some existing burn-in tools can be upgraded by depopulation, i.e. using the same equipment to test a smaller number of CPU's. This can allow multiple clock rate and power supply demands to be serviced without replacing the equipment. However, factory throughput is greatly reduced, or the amount of floor space required to burn-in the same number of CPU's is increased.

Accurate and frequent measurement of the operating physical parameters of the IC's allows for more precise control of these parameters. For example, during burn-in testing, a very small increase in voltage or temperature can significantly reduce the time required to complete a burn-in cycle and therefore increase factory throughput. On the other hand, too high a voltage or temperature can destroy the IC. In addition, with semiconductor chips, as the temperature increases, resistance drops, increasing the current for a fixed voltage. The increased current increases the temperature inducing a nonlinear feedback effect. Operation near the temperature and voltage limits, therefore requires an increased precision in measurements of the chips' physical parameters and a faster response time. As the geometry of chip architecture grows smaller and smaller, the chips become more susceptible to gate oxide breakdown, requiring further increases in precision and speed.

In order to regulate the voltage on a chip during burn-in, typically, the voltage at the output of the voltage regulator module that powers the chips is sensed. This voltage may be different than at the chip and it may change more slowly than the voltage at the chip. In addition, due to variations in signal path, chip temperature, and chip constitution, the voltages differences may differ at different chips. As a result, chip voltage cannot be accurately determined at a voltage regulator module output.

As burn-in currents are increased, so are voltage drops along the power path and the corresponding amount of heat that must be dissipated. The increased voltage drops increase the difference between the voltage regulator module voltage and that of each chip. In order to prevent the chips from being overstressed during burn-in, the set point voltage is lowered at the voltage regulator module. However, this increases the burn-in time. As a result more burn-in chambers are required to achieve the same production volume.

During diagnostic and burn-in processes a single test signal generator can be used to send instruction sequences to a group of IC's at the same time, or in quick succession. Many IC's require these signals in a gunning transceiver logic (GTL) level and the signals are often transmitted as low voltage transistor-to-transistor logic (LVTTL). While LVTTL signaling may work well over the short, low power, protected distances typical in operational components, in a system designed to test a group of IC's these signals must run longer distances across spaces with higher amounts of interference. As speed, power and heat increase, LVTTL signals are more frequently distorted or changed, increasing communication error rates. The distorted signal could have a significant effect on the IC's internal input/output structure and could lead to permanent damage if not controlled properly. In addition, such errors may result in non-genuin failure, which requires that sequences be repeated, increasing the amount of time required for execution.

BRIEF DESCRIPTION OF THE DRAWINGS

Embodiments of the present invention will be understood more fully from the detailed description given below and from the accompanying drawings of various embodiments of the invention. The drawings, however, should not be taken to be limiting, but are for explanation and understanding only.

DETAILED DESCRIPTION

Several abbreviations are used in the text that follows. They are spelled out as they occur. For the reader's convenient reference, a few of the abbreviations are listed below. This list of abbreviations is not complete. All abbreviations are intended to simplify reading, not to suggest that any particular structure or process is required.

Figure 1:
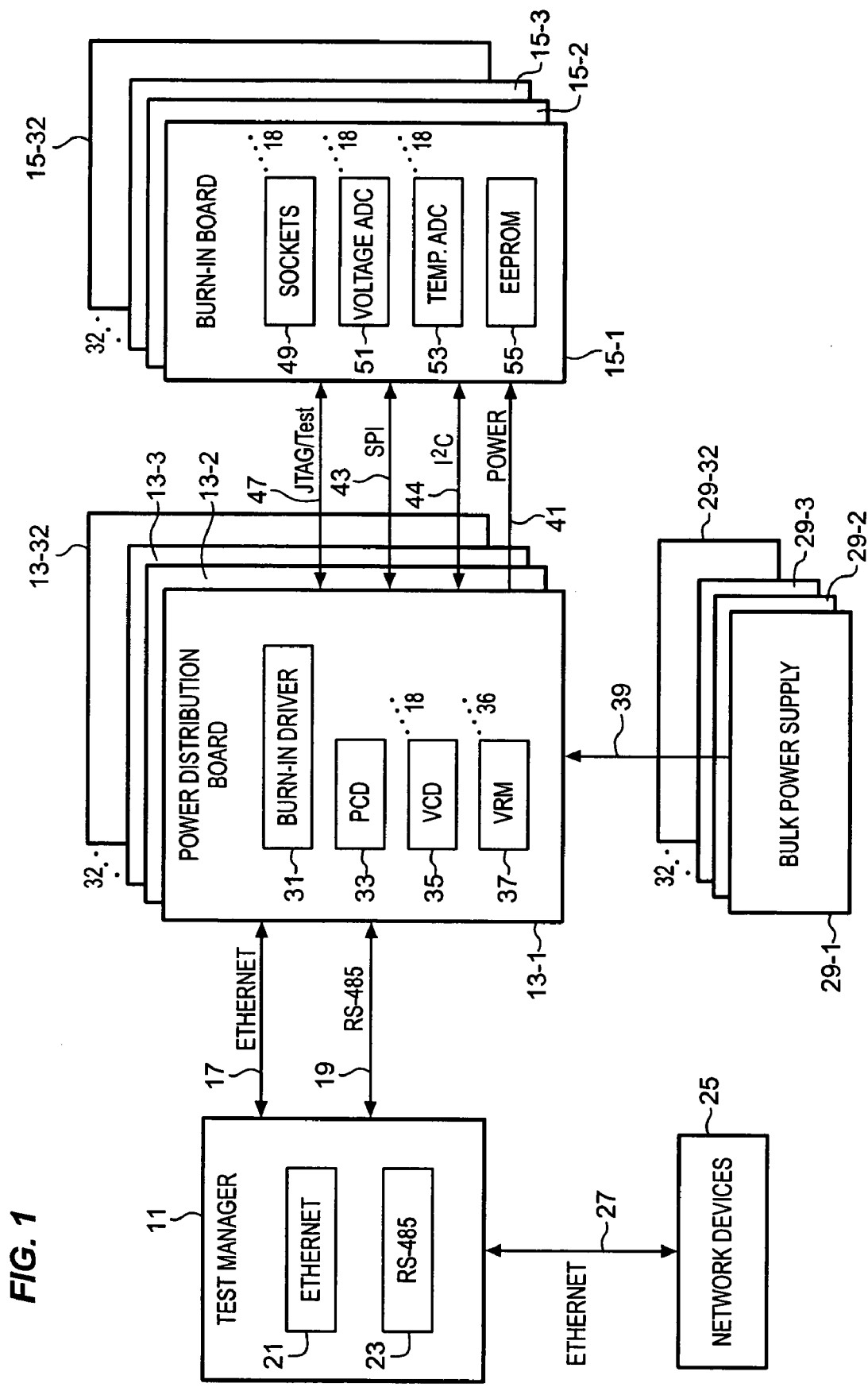
FIG. 1 is a block diagram of a burn-in and diagnostic system according to an embodiment of the invention.

ADC Analog-to-Digital Converter
BIB Burn-In Board
BID Burn-in Driver
DUT Device Under Test
EEPROM Electrically Erasable Programmable Read Only Memory
GTL Gunning Transistor Logic
LVDS Low Voltage Differential Signaling
LVTTL Low Voltage Transistor to Transistor Logic PCD PDB Card Daughter
PDB Power Distribution Board
VCD VRM Card Daughter
VRM Voltage Regulator Module FIG. 1 shows a high level block diagram of an example of a system that may be used to burn-in and perform diagnostic testing on CPU's or other IC's. The present example will be described in the context of CPU burn-in, however, the apparatus and processes described may also be used to perform any of a variety of other tests and analyses of any of a variety of different IC's. The DUT's (Device Under Test), which may be any type of IC chip, are placed in sockets 49 of a Burn-in Board 15. The Burn-In Board carries the DUT's in their sockets and measures their parameters, such as temperature and voltage. A Power Distribution Board 13 receives these measurements and controls the temperature and voltages at blocks 33, 35, and 37. It also generates instruction sequences in a burn-in driver 31 for the IC's to execute during the process. The instruction sequences may be used to test or condition the intended portions of the DUT. Connectors (see FIGS. 3 and 4) carry the data 43, 44, 47 signals and power 41 between the Burn-in Board and the Power Distribution Board. The connectors also allow power distribution and burn-in boards to be interchangeably connected and disconnected so that the two components may be serviced independently of each other or connected to other components.

Referring to FIG. 1 in more detail, the illustrated burn-in system features a test manager 11 coupled to a PDB (Power Distribution Board) 13 that is, in turn, coupled to a BIB (Burn-in Board) 15. As shown in the example of FIG. 1, the test manager may drive many PDB's and BIB's. In the illustrated example, the test manager is coupled to 32 PDB's 13-1, 13-2, 13-3, . . . 13-32, which are each coupled, respectively to one of 32 BIB's 15-1, 15-2, 15-3, . . . 15-32. More or fewer PDB's may be coupled to the test manager depending on the particular application. In addition, a PDB may be coupled to more or less than one BIB, depending also on the particular application. The configuration of FIG. 1 is provided as an example of one of many different possible configurations.

The test manager provides overall high level supervision and control of the burn-in process and provides any necessary software revisions or replacements for the PDB's and BIB's. The test manager may be based on many different hardware architectures. It may be constructed, for example, using conventional personal computer architecture with a CPU, mass storage and bus interfaces. In the example of FIG. 1, the test manager communicates with the PDB using conventional Ethernet 17 and RS (Recommended Standard adopted by the Electrical Industries Association)-485 19 personal computer network protocol connectors. Accordingly, the test manager includes a motherboard or adapter card based Ethernet driver 21 and a motherboard or adapter card based RS-485 driver 23.

The Ethernet driver may be used not only to communicate with the PDB but also with other remote network devices 25 over a system-wide Ethernet network 27. The system-wide Ethernet network may be used to allow the test manager to be remotely accessed or updated. Accordingly, a large quantity of test managers may be managed or supervised from a central location. Ethernet and RS-485 are shown in FIG. 1 as examples of reliable, and well-developed communications protocols, however, any desired protocol may be used. The communications channels may be wired, or wireless, electrical, electromagnetic, or optical.

In the illustrated embodiment, a single bulk power supply 29 is used for each PDB. Each bulk power supply is coupled to a PDB using high power cables 39 that connect to a power bus (not shown) inside the PDB. In the illustrated example using 32 PDB's, there are accordingly 32 bulk power supplies 29-1, 29-2, 29-3, . . . 29-32. A high current (400 A), low voltage (12 VDC) bulk power supply may be used that operates from a conventional 480 VAC facility power mains input. The particular specifications for the bulk power supply may be selected to suit a particular application.

For a slot-based design the bulk power supply, PDB and BIB may be the main electrical slot-level subassemblies. Each subassembly may be constructed in a separate independent chassis that may be carried in a slot of a standard production rack. In one embodiment, a PDB and BIB are connected together and carried in a single slot of the industrial electrical rack, while the bulk power supply is carried in another slot. Such a burn-in chamber rack may also have slots to accommodate a factory control system and a thermal cooling and heating system (not shown). In one embodiment, each of the slot-level subassemblies are independent from the others, which allows burn-in to continue with some subassemblies while other subassemblies are being serviced, repaired, or restocked. In the illustrated example, three racks of 32 slots each may be used to carry 32 of each of the subassemblies, while the test manager may be located in a nearby or remote location.

The PDB and BIB are constructed as two different subassemblies in the example of FIG. 1. The BIB holds the DUT's in sockets and has all the supporting electronics to interface with the PDB. The PDB uses three simple networks and two power buses to provide efficient data transmission and significantly reduce signal connections between the two sub-assemblies. This reduction in signal connections, may be used to greatly reduce the size and the complexity of the interface between the PDB and the BIB. In the illustrated example, an SPI (Serial Peripheral Interface, a master/slave interface defined by Motorola) bus 43, an I²C (Inter-Integrated Circuit, a type of bus designed by Phillips Semiconductors to connect integrated circuits) bus 45, and a IEEE (Institute of Electrical and Electronics Engineers) 1149.1/P1149.4 JTAG (Joint Test Action Group) TAP (Test Access Port) and Boundary-Scan Architecture Test Bus were chosen. An SMBus (System Management Bus) variant of the I²C bus may be used to accommodate standard chip designs. While many other simple or complex network interfaces may be used instead, these interfaces are readily available on commercial microcontrollers and peripheral components. The particular interconnections and operation of these buses will be described further with reference to FIG. 2.

The PDB's 13 each include a BID (Burn-in Driver) 31, a group of VRM's (Voltage Regulator Module) 37 to supply power to the DUT's, a PCD (PDB Card Daughter) 33 to control temperatures and voltages during burn-in, and a group of VCD's (VRM Card Daughter) 35 to control the VRM's. These components are described in more detail with reference to FIG. 2. In the illustrated example, there are 18 DUT's on the BIB to be supported by each PDB. The PDB has 18 VCD's, one per DUT and 36 VRM's, or two per DUT. Each VCD controls two VRM's using two separate control circuits. The number DUT's is provided as an example, 24 or more DUT's may be accommodated on a single BIB.

In the present example, two VRM's are used to power each DUT. This allows the total amount of power per DUT to be doubled. This may also be used to accommodate two different voltages on each DUT. Alternatively, the BIB may be designed to connect up to four VRM's to each DUT in order to increase power or increase the number of different voltages. For lower power DUT's or higher power VRM's the 36 VRM's may be used to drive 36 or more DUTt's. These variations may be effected using a single PDB configuration by changing the power lines in the BIB and the software voltage set points for the VRM's. The particular choice of and number of different components may depend on the particular application.

Accordingly, in the example of FIG. 1, two connected burn-in slots, one slot carrying a bulk power supply, and the other slot carrying the PDB and BIB, may test or burn-in 18 DUT's at 200 Watts or more each (3,600 Watts/Slot) with two Vcc inputs per DUT. The PDB may serve as a main power and signal subassembly. The PDB provides the BIB with burn-in power from the VRM's over its power connector 41. In the present example, this may be at 200 Watts or more for each CPU for a total of 3,600 Watts per rack slot.

The BIB 15, as mentioned above, carries the sockets 49 for the DUT's. In the illustrated example, there are 18 sockets. For each socket there is a voltage ADC (Analog-to-Digital Converter) 51 and a temperature ADC 53 which will be described more fully below. Each BIB also carries a readable memory register, such as an EEPROM (Electrically Erasable Programmable Read Only Memory) for identification purposes. The information in the EEPROM may depend on the particular application, however, it may include serial numbers, a service hour counter, a cycle counter, and a build type.

Figure 2:
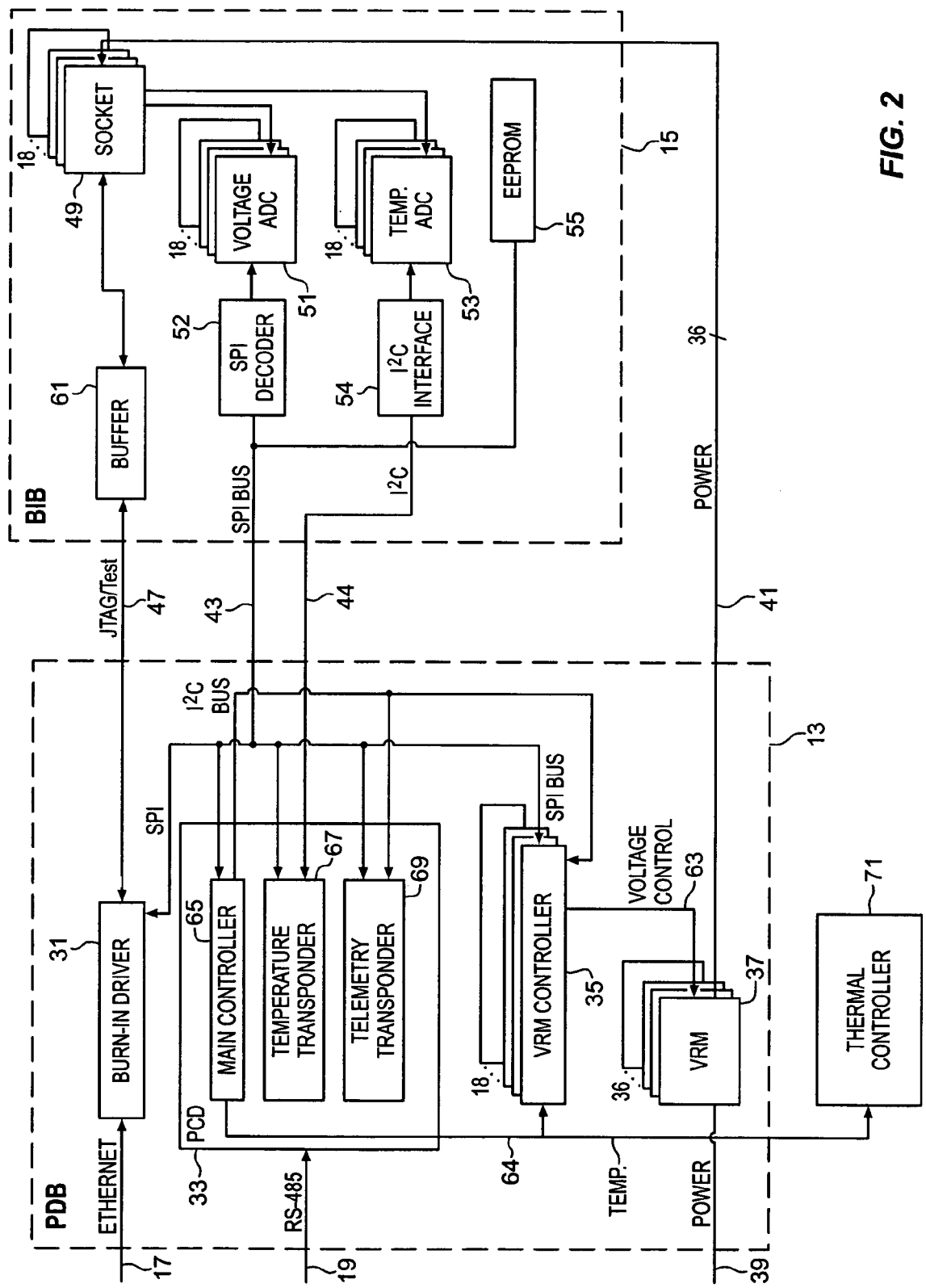
FIG. 2 is a block diagram of the power distribution board and burn-in board components of the system of FIG. 1.

FIG. 2 shows a single PDB and BIB such as those of FIG. 1 in more detail. The Ethernet connection 17 to the test manager 11 is coupled directly to the BID (Burn-in Driver) 31. This connection may be used to load instruction sequences for the DUT's into the BID that may be operated by the DUT's during burn-in or any other test or diagnostic process. The BID may also send results from the instruction sequences from each DUT over the Ethernet connection back to the test manager. This may allow the test manager to compile a report on the status and condition of each DUT. For example, the BID may report back to the test manager which DUT's test out as operational and which DUT's have failed certain tests. Depending on the nature of the DUT and the instruction sequences, the BID may be able to report on exactly which portions of each DUT have passed and which ones have failed.

In the illustrated embodiment, the DUT's and BID are IEEE 1149.1/P1149.4 JTAG TAP and Boundary-Scan Architecture compatible. This JTAG protocol is widely used and is designed to test and interface with IC's. However, any other type of signaling may be used and the choice may depend on the nature of a particular DUT. The BID sends the instructions and receives results to each DUT through a JTAG/Test connection 47. This connection is carried from the BID to a buffer 61 on the BIB and then to each of the sockets 49 on the BIB. In the illustrated embodiment, a subset of JTAG diagnostic signaling is used to send and receive test signals to the DUT's.

The BID is microcontroller based and interfaces to the PDB via a conventional socket edge connector. This connector may be similar to a PCI (Peripheral Component Interconnect) socket and interface or any other well-established edge connector interface. This allows the BID to easily be replaced or upgraded. It also allows the rest of the PDB to be put back into service if the BID fails by quickly replacing the defective BID. Diagnostics for the failed BID may be performed independently of the PDB. A single BID may be used to provide the necessary test signals for all 18 DUT's. The BID may operate independently or under the control of the test manager or the PCD.

The voltage and temperature conditions of each DUT are monitored by the PCD 33 and its microcontrollers. The voltage supplied to each DUT is controlled through microcontrollers on the PCD. These microcontrollers include a main controller and voltage transponder 65, a temperature transponder 67 and a telemetry transponder 69. In one embodiment, these microcontrollers are low power eight-bit reduced instruction set microcontrollers with system programmable flash memory and integrated $I^2C$, SPI, and RS-485 interfaces. External chips for bus communications, such as an external RS-485 interface chip may also be used. Suitable microcontrollers for use in the PCD include the ATmega line of microcontrollers from Atmel Corporation. The main controller may communicate with the test manager using the RS-485 bus 19 or any other type of communication path. Commands and data may be passed down to the other microcontrollers of the PCD and to the EEPROM 55 on the BIB over the SPI bus 44, or any other type of bus. In one embodiment, the main controller of the PCD is the master of the SPI bus. The main controller may also monitor DUT voltages on the SPI bus and then pass this information to other microcontrollers over the $I^2C$ bus. Status signals may also be made available to other microcontrollers and to the test manager.

The temperature transponder microcontroller 67 monitors the DUT temperatures from the BIB via the $I^2C$ bus. The precise nature of this temperature depends on the design of the BIB. In one embodiment, this temperature is a junction temperature (Tj) made available across two external pins of the DUT. The temperature transponder microcontroller may also be used to monitor several BIB and PDB supply voltages, BIB over-current, and local PDB temperatures. Using this information, it may provide a temperature telemetry data stream to a thermal controller 71 via a second SPI bus 73. The thermal controller drives fans, heaters, air conditioners, liquid coolers, or other thermal devices (not shown) to regulate the temperatures of the DUT's and other components of the system.

The telemetry transponder microcontroller 69 may be used to monitor voltages, currents, and temperatures from any connected microcontrollers via the $I^2C$ and SPI bus and to produce a telemetry stream that may be sent to the BID, to the test manager upon command via the RS-485 bus or any other bus and to any other networked devices. It may also serve as a bus master for any of the network buses that are used. By providing these communications and bus mastering functions, it relieves the other microcontrollers of any related interrupts and processing demands. The telemetry data streams to and from the telemetry transponder may include the status of any desired functions and systems.

The PDB also contains VCD's or VRM controllers 35 and the VRM's 37. The VCD's may be implemented as swappable daughter cards that are installed into slots in the main power distribution board, as described in more detail with respect to FIG. 3. Similarly the VRM's may be implemented as swappable cards so that the VCD's and VRM's may be quickly replaced and diagnosed off-line. The VCD's are coupled to the voltage controller 65 over an SPI bus 64 In the illustrated example, one VRM controller is used for every two VRM cards or 18 total. There are two VRM's per card. The VRM controllers are coupled to the VRM's over a set of 36 discrete voltage control signal lines 63. Alternatively, one microcontroller may be used per VRM or thirtysix total. Increasing the number of VRM microcontrollers may support flexible ganging and multiple voltage supplies per CPU.

The VCD's and VRM's may be low-cost, off-the-shelf VCD's and VRM's that may be carried in a conventional edge connector socket, and configured to power the 18 DUT's with multiple voltages and power requirements. More DUT's may be powered if only one power supply is required for each DUT. Off-the-shelf VCD's and specially designed VCD's may be obtained from Celestica, Inc. of Toronto Canada. One current off-the shelf VRM is a VRM 9.1 from Celestica. It supplies 1.1-1.85 VDC up to 80 Amps. The VRM 9.1 has 5 Voltage Identification (VID) codes or signals to provide programmable 25 mV resolution steps. The VRM 10 from Celestica supplies 0.8-1.6 VDC up to 100 Amps and uses 6 VID signals to provide programmable 12.5 mV resolution steps. Both VRM's are gang-able through hardware and firmware designs to supply the DUT's with higher currents and multiple voltage sources.

The VRM controllers get their unit numbers and master/slave assignments from the PDB main controller via the SPI bus 64. Depending upon their assignments, each VRM controller may be set up to originate, pass along, or terminate its VRM signals such that the VRM's will act in groups for current sharing. VRM controllers may apply algorithms for "Soft Start", current foldback, and temperature fold back and may close the loop for the desired programmed voltage commanded by main controller.

Figure 3:
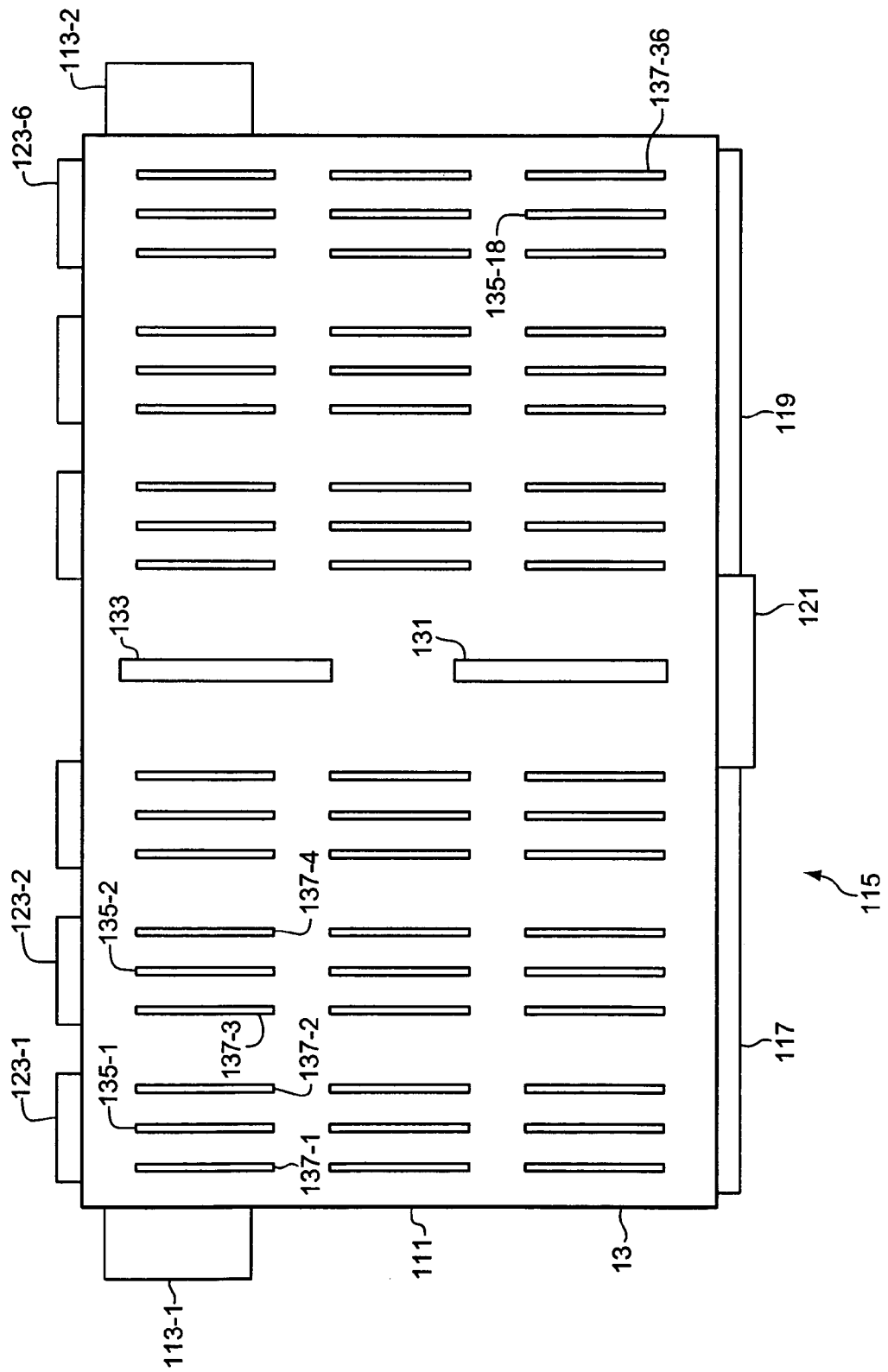
FIG. 3 is a diagram of an unpopulated power distribution board and chassis according to an embodiment of the invention.

FIG. 3 shows a diagram of an example of a PDB (Power Distribution Board) 13 with all of the slot-mounted cards removed. As described above, the PDB may be a multi-layer printed circuit board designed to carry multiple power lines (not shown) on some planes and multiple data buses (not shown) on other planes between the various microcontrollers and power supplies. The board is mounted into a protective chassis 111, which may be fabricated of aluminum or any other durable, heat conductive material. The chassis is designed to house and protect the mounted components and also to fit into a slot in a conventional industrial electrical processing rack. However, the particular form factor, shape and configuration for the chassis and the PDB may be adapted to suit a variety of different applications.

The chassis includes a left side bulk power connector 113-1 to couple power from the bulk power supply into the PDB. It has a right telemetry and control connector 113-2 to couple the PDB to the test manager, thermal control and other equipment. It also includes a set of six high flow cooling fans 123-1, 123-2, . . . 123-6 along one side and between the two bulk power connectors. The fans may be run constantly or controlled by the thermal controller 71 or any other thermal control system. The fans are positioned so that when a BIB is coupled to a PDB, the six high flow fans force air across both the PDB and the BIB.

The PDB also includes a connector 115 to couple power and data from the PDB to the BIB. The connector of the illustrated embodiment has a left side power coupling section 117, a right side power coupling section 119, and a central data coupling section 121. This connector mates with a matching connector on the BIB to carry all data and power, however, any of a variety of other coupling devices may also be used. The PDB also has Ethernet, RS-485 or other network and power connections to other external components (not shown).

Figure 4:
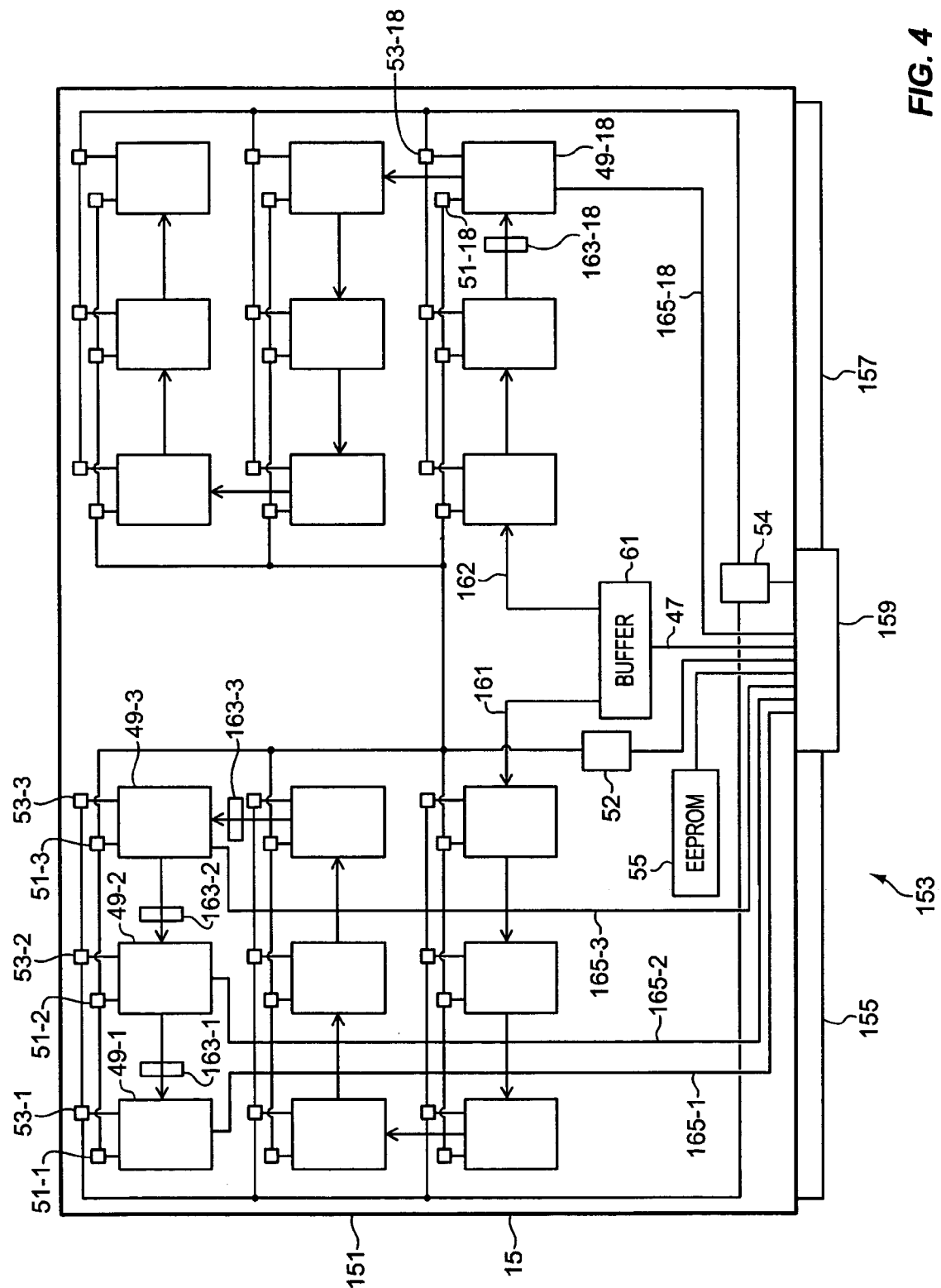
FIG. 4 is a diagram of an unpopulated burn-in board and chassis according to an embodiment of the invention.

In the illustrated embodiment, the top surface of the PDB is populated with sockets or slots to carry the components described above. A socket 133 for the PCD (Power Distribution Board Card Daughter) is positioned along the center column of the card near the bulk power supply connectors. A socket 131 for the BID (Burn-In Driver) 31 is positioned along the center column near the BIB connector. The two center column sockets define a left hand and right hand side of the PDB for the 18 VRM (Voltage Regulator Module) controllers and the 36 VRM's. The sockets for the VRM controllers or VCD's (VRM card daughter) and the VRM's are placed in eighteen groups of three with one VCD socket and two VRM sockets in each group. As shown in FIG. 3, a matrix of three columns and three rows of three-card groups are placed on each side of the PDB. In the top left of the PDB as shown in FIG. 4, is a VCD socket 135-1, with a VRM socket 137-1, 137-2 on either side. Two more groups are below this first group and two further groups are to the right side of this first group. The pattern is repeated on the right hand side of the cards.

In the illustrated embodiment of the invention, the sockets of the PDB are arranged parallel to each other and aligned in rows. The parallel design allows a large number of cards to be carried in a very small space. By aligning the cards in rows, airflow from the cooling fans is eased. Using sockets to carry independent cards or daughtercards allows all of the microcontrollers and VRM's to be quickly replaced for servicing or repair. However, the particular arrangement and number of sockets may be modified to suit any particular application. In addition, it may be preferred to mount all components directly to a single printed circuit board or to several different printed circuit boards to suit the needs of a particular application.

FIG. 4 is a diagram of a BIB (Burn-In Board) 15 with all of the DUT's removed. In one embodiment of the invention, the BIB is a multi-layer printed circuit board with separate planes for DUT power, board-level component power and data. The board is mounted in a protective aluminum chassis 151 adapted to be carried in a slot or an equipment rack and also to be manipulated by an automated material handler.

As shown in FIG. 4, the BIB (Burn-In Board) carries eighteen sockets 49-1, 49-2, . . . 49-18, one for each of the IC's that are to be tested. In one embodiment, the DUT's are microprocessors and the sockets are similar to or the same as conventional motherboard sockets such as type 478, 603, or 604 sockets. In the illustrated embodiment, the sockets are arranged in two matrices of three columns and three rows, one matrix on each side, left and right, on the BIB. The sockets are spaced out over most of the surface of the BIB to maximize packing density and cooling. However, the particular arrangement of the sockets may be adapted to suit different applications. There may be more or fewer sockets depending upon the relative size and thermal characteristics of the DUT's and the sockets.

The BIB also includes a connector 153 to couple power and data from the PDB to the BIB. The connector of the illustrated embodiment has a left side power coupling section 155, a right side power coupling section 157, and a central data coupling section 159. This connector mates with the matching connector 115 on the PDB to carry all data and power, however, any of a variety of other coupling devices may also be used. The BIB may also have other network or power connections to other external components (not shown).

The DUT's to be burned in are placed in the BIB's sockets, which provide all electrical connections. The embodiment of the BIB shown in FIG. 4 provides clock, data signaling, and power to 18 DUT's. In one embodiment, the power for each DUT is supplied by two VRM's (Voltage Regulator Modules) 37 at 200 Watts or more each. The physical layout may be adapted to enable direct contact with a specialized thermal cooling system.

In one embodiment, a high-density sixteen-layer BIB may be made from a 24"×14" standard PCB (Printed Circuit Board) to support the power and signal requirements of the 18 CPUs. Ten of the layers may be dedicated to high-power conduction in order to maximize current flow. Using between 2 to 4-ounce copper in each power layer allows upwards of 100 Amps per voltage source to be carried with low voltage (or IR) drop. Low power path voltage drops help to minimize losses and heat. The ten power layers allow 200 Watts or more to be delivered to each of the 18 CPU's.

The BIB also includes an EEPROM 55 that stores information about the BIB and the DUT sockets together with any other desired information. The BIB EEPROM may reside on the SPI bus so that the data in the BIB EEPROM is independently available to all of the connected controllers on the PDB. For example, the EEPROM may be used to store a BIB identification number, a total cycle count, a last PM (Preventative Maintenance) date and the number of cycles since the last PM. A BIB identification number may be used to allow the PDB to configure itself to match the product type being tested. The BIB EEPROM may also be used for power up and power down sequences. For example, a BIB present signal may be used to tell the PDB main controller and BID that the BIB is ready to start a burn-in process The BIB may be designed as a flexible sub-assembly capable of interfacing with a variety of different PDB's. It may also be designed to accommodate a variety of different DUT's. To accommodate other DUT's, signal and power pin modifications may be made, multiple voltage sources or high current needs may be accommodated. The BIB may also be adapted to work with an automated material handling system using, for example, metal rails to transport the BIB to and from a burn-in chamber rack and then to a DUT loading and unloading section. The DUT loading and unloading section allows the material handling section to populate and depopulate the sockets with the CPU's or other IC's that are to be burned in.

As further shown in FIG. 4, from the central data section 159 of the connector, the JTAG standard TAP (Test Access Port) test signals 47 from the BID (Burn-In Driver) are coupled to the buffer 61, which in turn, transmits the JTAG test signals to the socket for each DUT. The signals may travel along two branches 161, 162 from the buffer to reach each of the sockets. In one embodiment, the BID generates a single set of signals which is sensed by a decoder 163-1, 163-2, 163-3, 163-18 at each socket. One example of a suitable encoder is a SN75LVDS390D decoder available from Texas Instruments, however any suitable decoder may be used. The DUT transistors may be toggled via the TDI (Test Data In) JTAG signal provided by the BID. TDI may be connected in parallel to the DUT's and 18 TDO (Test Data Out) signals may be returned to the BID on 18 discrete signal paths 165-1, 165-2, 165-3, . . . 165-18 (only four are shown) to determine if each DUT is operating properly.

Due to the different locations for each DUT socket, the JTAG TAP signals travel different lengths to and from the BID. The BID may compensate for the total delay in the TDO signal differences. The variations in delay may also be reduced by the design of the signal paths. As shown in FIG. 4, the DUT sockets are divided into a left-hand and a right-hand group and the TDI signals are routed from each DUT to its nearest neighbor. This tends to shorten the overall path and reduce the maximum delay from the buffer to the furthest DUT. For the example of FIG. 4, the maximum signal delay variance is less than 10 nanoseconds. For reference, a typical TCK (test clock) rate is approximately 1 to 10 MHz or one pulse every 100 to 1000 nanoseconds. Accordingly such a delay will not interfere with signal communications.

Signal fidelity may be further enhanced from the BID to the DUT's using LVDS (Low Voltage Differential Signaling) transmission circuitry. LVDS signaling may be used to provide low noise and high edge rates suitable for backplane driving. As a result, the pin count of the connector between the BID and the PDB may be lowered. Rather than provide separate channel routing for each DUT, with LVDS, the input pins may successfully be shared among all of the DUT's. The signal distribution and routing on the BIB may be designed to go through several signal translations starting from the LVTTL (Low Voltage Transistor to Transistor Logic) signal from the BID (Burn-In Driver) to a LVDS signal at the buffer and ending with LVTTL Open drain signal buffer at the decoder at each socket.

The signals from the BID on the PDB are received through the data portion of the PDB connector 159 as LVTTL signals at the BIB buffer 61. In one embodiment, the BID and the BIB buffer are placed very close to each other on opposite sides of the data portion of the PDB-BIB connector. This reduces degradation of the LVTTL signals along this path. The buffer acts in part as an LVDS encoder and level shifts these signals to LVDS. They are then routed in the serpentine format shown in FIG. 4 to each DUT socket 49. At every DUT location, the signal bus is translated by the corresponding LVDS encoder to LVTTL signals and subsequently goes through a LVTTL to open drain buffer (not shown) where pull-up termination is used to provide signals with the right level to the DUT. In order to service all of the desired test pins on each socket, more than one decoder may be used. In one embodiment, the sockets are a 478 type and three decoders are used at each socket in order to send the TDI signals to each pin.

As shown in FIGS. 2 and 4, in the illustrated embodiment, voltage ADC's 51-1, 51-2, 51-3, . . . , 51-18 are networked to a serial bus through an SPI decoder 52 which transmits the voltage sense data back to the PDB main controller and voltage transponder 65 over an SPI bus on an on-going basis as telemetry data. In the illustrated embodiment, up to 36 voltage readings, two readings for each DUT may be monitored on a single SPI bus line. In one embodiment, this voltage reading is taken by connecting to the Vcc and Vss pins of the IC and converting the difference between these analog voltages to a digital voltage measurement value.

The network bus-based voltage sense architecture reduces the number of channels required for the PDB controller to monitor all of the 36 voltage sense points coming from the BIB. This simplifies the interconnection between the PDB and BIB, as well as reducing the number of signal paths on the PDB and BIB. Converting the analog voltage signal to a digital signal near the DUT also eliminates the voltage sense inaccuracies caused by changes in the analog levels in voltage signal lines. The accurate measurements allow each chip to be independently driven at its optimum burn-in voltage.

The SPI network bus, based in the PCD's main controller 65 on the PDB 13, connects to the voltage ADC's 51 on the BIB 15. In one embodiment, The PCD main controller sequentially polls each ADC on the BIB through the SPI address lines (SPI_A0 to SPI_A3) and chip select decoding circuitry. These four SPI address lines provide the address decoding logic. In one embodiment, the ADC's are capable of reading eighteen CPUs with dual Vcc inputs, such as VccSense and VssSense. Each data stream from each voltage sense point is transmitted back to the PDB controller over the SPI bus with a unique address.

The VccSense and VssSense inputs may be read as analog connections to a CPU's internal voltage reference points. These reference points are provided on external pins of each CPU. Alternatively, the voltage may be sensed at the socket or at some other location on the BIB. The analog voltage levels are sampled, converted to digital data, and made available to the microcontroller via the SPI network bus.

The illustrated voltage sense architecture design is flexible enough to support DUT's with any number of voltage sense points and voltage input requirements. Using an SPI bus shared between 18 ADC's, the design provides a high sampling rate fast enough for the voltage regulator modules (VRM) on the PDB to regulate the voltage to the DUT even during high current draw. With eighteen ADC's in the illustrated embodiment, each complete polling cycle takes about 250 ms to sample all eighteen ADC's (addresses CS0 to CS17). Thus the voltage to each DUT may be adjusted every 250 ms.

According to one embodiment of the invention, DUT voltage is measured right at the DUT and immediately converted from an analog reading to a digital data stream to preserve its accuracy. The analog conversion may use 10-bit successive approximation for each DUT Vcc supply. With 10-bit accuracy, a sensing voltage from less than 1 V up to 2.5 V with 7 mV resolution may be accommodated.

Once the PDB main controller and voltage transponder 65 receives the data stream, it may compensate by calculating the difference between the measured voltage and the desired voltage or the DUT voltage set point. The main controller then transmits the compensation data to the corresponding VCD 18. It may adjust the voltage identification (VID) bits on the corresponding voltage regulator or VCD 35 to either increase or reduce the output set point. The VCD microcontroller then increments or decrements the VRM VID (Voltage Identification) signals to adjust the VRM 37 voltage output. The VID lines 63 are the voltage control signals from the VCD's to the VRM's to set the VRM output voltages. This technique ensures that the voltage at the DUT pin is accurate to within the resolution of its set point value and is independent of current loading and voltage drop. The accuracy that can be achieved may depend upon the VCD and VRM combination. An accuracy to within 12.5 mV to 25 mV is available with currently available equipment.

VRM's are typically configured to sense their output voltage only at their output connection point. Extending the voltage sense point out to the DUT socket and adding a VRM controller with an active feedback system greatly improves the accuracy of the sensed voltage.

As also shown in FIGS. 2 and 4, in the illustrated embodiment, temperature ADC's 53-1, 53-2, 53-3, . . . , 53-18 are networked to a serial bus through an I²C interface 54 which transmits the temperature sense data back to the temperature transponder 67 over an I²C bus on an on-going basis as telemetry data. In the illustrated embodiment, up to 18 temperature readings, one reading for each DUT can be monitored on a single I²C bus line.

A conventional temperature sensor and converter, such as a G781 from Global Mixed Mode Technology, Inc. of Taiwan offers a stabilized source and detector to be coupled to external temperature junction diode connector pins of an IC. It also provides a local temperature measurement and an integrated SMBus interface. Accordingly, such a device may be used to provide two temperature measurements, a DUT temperature and a local BIB temperature on the I²C bus for use by the temperature transponder.

The network bus-based temperature sense architecture reduces the number of channels required for the temperature transponder to monitor all of the 18 DUT temperatures coming from the BIB. This simplifies the interconnection between the PDB and BIB, and reduces the number of signal paths on the PDB and BIB. Converting the analog voltage signal to a digital signal near the DUT also eliminates the temperature sense inaccuracies caused by changes in the analog levels in voltage signal lines. The accurate measurements allow each chip to be independently driven at its optimum diagnostic or burn-in temperature. The interaction between high temperature and voltage in silicon can also be accommodated using precise and timely information about both parameters.

The I²C network bus, based in the PCD's main controller 65 on the PDB 13 connects to the temperature ADC's 53 on the BIB 15. The temperature transponder 67 sequentially polls each ADC on the BIB through the I²C bus and each data stream for each DUT temperature sense point is transmitted back to the temperature transponder over the I²C bus with a unique address.

The DUT temperature inputs may be read as analog connections to a CPU's internal temperature sensing diode. Access to these diodes are provided on external pins of each CPU. Alternatively, the temperature may be sensed at the package, socket or at some other location on the BIB. The analog voltage levels are sampled, converted to digital data and are available to the microcontroller via the I²C network bus. The illustrated temperature sense architecture design is flexible enough to support DUT's with any number of temperature sense points and may transmit each measured value or a calculated combination value back to the temperature transponder.

Once the PDB temperature transponder 67 receives the data stream, it may compensate by sending control data to the thermal controller 71. It may also send temperature data to the PCD main controller 65, so that the main controller may make adjustments to the voltage supplied to specific DUT's. At high power and temperature, the operating voltage becomes very closely related to operating temperature.

Figure 5:
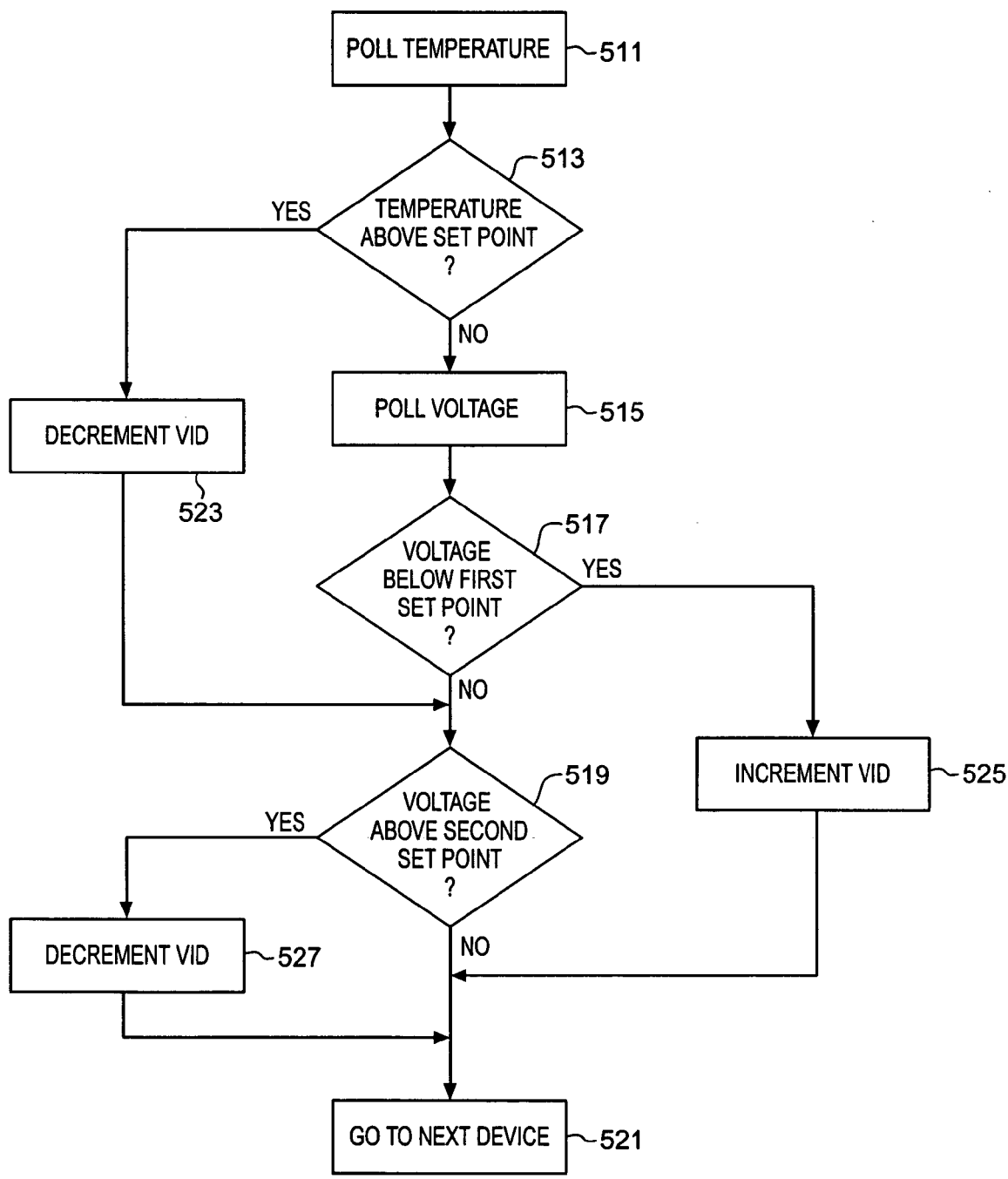
FIG. 5 is a process flow diagram of a voltage control process according to an embodiment of the invention.

Referring to FIG. 5, a process flow diagram indicates one technique for maintaining IC voltages during burn-in or diagnostics. There are many different possible techniques for maintaining voltages and more or fewer inputs than suggested by FIG. 5 may be used. In addition, there may be other control outputs to adjust other than voltage. For example, the thermal controller 71 may be used to respond to temperature or voltage changes in addition to or instead of the DUT input voltage.

In FIG. 5, at block 511, the temperature is polled for a particular DUT. As mentioned above, in one embodiment, there is a temperature transponder on a network bus with temperature ADC's. This transponder repeatedly polls the ADC's and then buffers the responses. These buffered responses may be made accessible to the FIG. 5 process through readable registers in a memory array. The temperatures may reflect temperature near a DUT, on a DUT package or on the semiconductor substrate of the DUT in one or more locations, or any combination of these and other temperature measurements.

At block 513, the resulting temperature is compared to a set point. The set point may correspond to a fail safe point beyond which IC failure becomes likely. If the temperature is not above the set point, then the process goes to block 515 at which the DUT voltage is polled.

As with the temperature, in one embodiment a voltage controller repeatedly polls voltage ADC's on a network bus and buffers the responses so that the values are available when needed. The voltages may correspond to an on-chip voltage, an input voltage or some combination of measured voltage signals. At block 517, this voltage is compared to a first voltage set point and if the voltage is not below the set point then the process goes to block 519.

At block 519, the voltage is compared to a second voltage set point. If the voltage is not above this second set point, then the DUT is operating within acceptable norms and the process goes to check the next DUT. The same process is repeated for all DUT's then repeated continuously until the test or burn-in has ended. The first and second voltage set points may be the same or they may be different. Providing some difference between the high and low voltage set points may stabilize the control loop. The specific values for temperature and voltage may depend on the type of DUT and the tests being performed.

When the temperature exceeds the temperature set point value, the process may then move to decrement the VID at block 523 and then check the temperature at block 519. The VID is the voltage control signal that is passed between the VCD and the VRM to set the VRM output voltage for a particular DUT. In the described embodiment of FIG. 2, the temperature transponder 67 will generate a decrement command for a particular DUT and send it on the SPI bus that connects it to the VCD's. The two VCD's responsible for the DUT in question will pick up the command and adjust their VID signals. This will be sent to the corresponding VRM's which in turn will reduce their output voltages to respond to the new VID number. By reducing the voltage at the DUT, the amount of power will also be reduced which will reduce the amount of heat generated by the DUT. Other measures may also be taken in response to a high temperature by thermal and other control systems. These measures may be a part of this process or an unrelated process.

When the voltage is below the voltage set point, then at block 525, the VID is similarly incremented and the process then goes to the next DUT. When the voltage is above the set point at block 519, the process then decrements the VID at block 527. The process may then proceed to the next DUT. As shown in FIG. 5, if the temperature is too high, but the voltage is low, the voltage will nevertheless be decremented because the low voltage decision block 517 is skipped. On the other hand if the both the temperature and the voltage are high, then the VID will be decremented twice in one cycle.

Many variations are possible for the process shown in FIG. 5. Many different possible interactions between temperature and voltage may be accommodated or the two physical parameters may be treated independent of each other. For a DUT with more than one voltage input all of the voltage levels may be checked independently of each other. In such a case, the process may treat each temperature level as if it were another DUT or it may handle each voltage level within the context of a single DUT.

Figure 6:
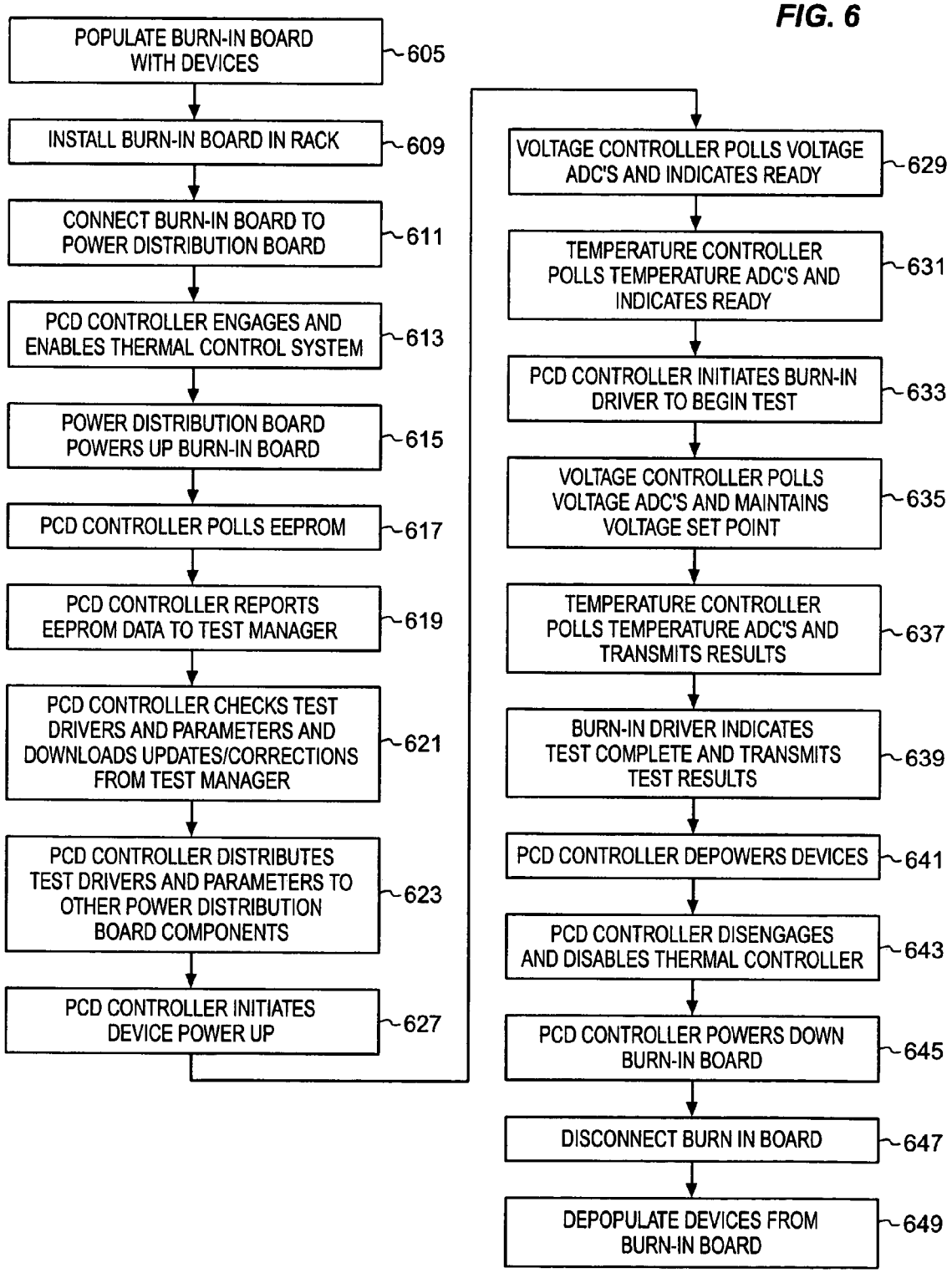
FIG. 6 is a process flow diagram of a burn-in system process according to an embodiment of the invention.

FIG. 6 shows an example of a burn-in process that can be implemented using the system described above. In FIG. 6, the burn-in process begins at block 605 by populating the Burn-In Board with the DUT's. As mentioned above this may be performed with an automated handler. At block 609, the Burn-In Board is installed in the equipment rack. This may also be performed by an automated handler. However, in less automated plants, these tasks may also be performed by hand. At block 611, the Burn-In Board is connected to the Power Distribution Board using, for example, the multiple pin connectors 115, 153 shown in FIGS. 3 and 4. At block 613, the PCD Controller engages and enables the thermal control system. The system is now mechanically assembled and ready to be configured.

Before the burn-in test sequences begin, the system may be configured. While, a flexible reconfigurable BIB and PDB have been described, the system may also be constructed as a dedicated system, in which case all of the necessary instruction sequences and test parameters may already be resident in the appropriate microcontrollers. At block 615, the Power Distribution Board powers up the Burn-In Board. The ADC's, encoders, decoders, EEPROM and any other components are now active, but the DUT's are not.

At block 617, the PCD Controller may then poll the EEPROM on the BIB. This transfers the information about the DUT type and other parameters about the BIB. At block 619, the PCD Controller reports the EEPROM data to the Test Manager. The Test Manager may use this data to log specific details about the DUT's, to track BIB usage and for many other purposes. The test manager may also increment the EEPROM cycle counter or any other system counters and store the updated values back in the EEPROM. In one embodiment, the Test Manager checks a library of test drivers and parameters for the DUT's in the BIB and then checks to ensure that the latest versions are resident on the PDB. At block 621, if the PDB does not have the appropriate drivers and parameters or if there are any required upgrades or corrections, then the Test Manager downloads test drivers and parameters to the Power Distribution Board.

Having confirmed that it has the appropriate parameters and drivers, at block 623, the PCD Controller configures the other Power Distribution Board Controllers and components. In one embodiment, the PCD controller serves as a bus master and loads the appropriate parameters and drivers over the SPI bus that connects them. With configuration established, the burn-in cycle, or other test or diagnostic cycle may be initiated.

At block 627, the PCD Controller initiates power up for the DUT's. The power up cycle for the DUT's may be performed by establishing a power-on low voltage that is slowly increased based on a timed schedule or it may be performed in some other way. At block 629, the Voltage Controller starts polling the Voltage ADC's and when the DUT's have reached the set point voltage, the Voltage Controller indicates a READY signal to the main controller. In the embodiments, described above, the Voltage Controller and the Main Controller are the same physical hardware. Similarly, at block 631, the Temperature Controller starts to poll the Temperature ADC's and when the temperature has reached the desired set point also indicates READY to the main controller. At this stage, the instruction sequences may be sent to the DUT's. Accordingly, at block 633, the PCD main controller initiates the Burn-In Driver. The BID then initiates the burn-in instruction sequences. However, any other type of test or diagnostic sequence may be initiated depending on the particular application.

As the instruction sequences from the BID are executed by the DUT's, at block 635, the Voltage Controller continues to poll the Voltage ADC's and maintain the temperature set point. At block 637, the Temperature Controller continues to poll the Temperature ADC's, the temperature information is provided to the voltage controller and may also be provided to a thermal controller. As mentioned above, a variety of different algorithms may be applied to the voltage and temperature data to maintain the set points. Thermal, voltage, current, clock speed and other conditions may be adjusted to maintain the set points. As the test sequences are continued, the telemetry controller may also continue to provide telemetry streams to different devices as appropriate to the design of the system.

After the test sequences have been executed, at block 639, the Burn-In Driver indicates that the tests have been completed. It may also provide the test results to the Test Manager, to the PCD Controller and to any other appropriate components. Upon completion of the test, at block 641, the PCD Controller depowers the DUT's, disengages and disables the thermal controller at block 643, and powers down the Burn-In Board at block 645. At block 647, the Burn-in Board may be disconnected from the Power Distribution Board and the equipment rack. Finally, at block 649, the Devices may be depopulated from the Burn-In Board. Using data collected by the Test Manager from the Burn-In Driver, the devices may be tagged as functional, defective, repairable, etc.

A lesser or more equipped power distribution board, burn-in board, control system, burn-in cycle and test cycle than the examples described above may be preferred for certain implementations. Therefore, the configurations may vary from implementation to implementation depending upon numerous factors, such as price constraints, performance requirements, technological improvements, or other circumstances. Embodiments of the invention may also be applied to other types of production processes that use components and device parameters than that shown in the Figures.

In the description above, for purposes of explanation, numerous specific details are set forth in order to provide a thorough understanding of embodiments of the present invention. It will be apparent, however, to one skilled in the art that embodiments of the present invention may be practiced without some of these specific details. In other instances, well-known structures and devices are shown in block diagram form.

Embodiments of the present invention may include various operations. The operations of embodiments of the present invention may be performed by hardware components, such as those shown in the Figures, or may be embodied in machine-executable instructions, which may be used to cause general-purpose or special-purpose processor, microcontroller, or logic circuits programmed with the instructions to perform the operations. Alternatively, the operations may be performed by a combination of hardware and software.

Embodiments of the present invention may be provided as a computer program product which may include a machine-readable medium having stored thereon instructions which may be used to program a computer system (or other electronic devices, such as microcontrollers) to perform a process according to embodiments of the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, embodiments of the present invention may also be downloaded as a computer program product, wherein the program may be transferred from a remote computer to a requesting computer by way of data signals embodied in a carrier wave or other propagation medium via a communication link (e.g., a modem or network connection).

Many of the methods and apparatus are described in their most basic form but operations may be added to or deleted from any of the methods and components may be added or subtracted from any of the described apparatus without departing from the basic scope of the present claims. It will be apparent to those skilled in the art that many further modifications and adaptations may be made. The particular embodiments are not provided as limitations but as illustrations. The scope of the claims is not to be determined by the specific examples provided above but only by the claims below.

What is claimed is:

1. An apparatus comprising:
   a burn-in board;
   a plurality of sockets on the burn-in board, each to hold an integrated circuit (IC) for test, each socket coupling power and communications to the respective IC;
   a first communications bus on the burn-in board coupled to each socket to communicate test signals to the IC's;
   a second communications bus on the burn-in board to communicate physical parameters of the IC's
   a plurality of analog-to-digital converters, each coupled to a socket to receive an analog voltage signal from an IC and to convert the voltage to a digital voltage value; and
   wherein the analog to digital converters communicate the digital voltage values of each of the IC's over the second communications bus for use in regulating the voltage coupled to each IC.

2. The apparatus of claim 1, wherein each socket couples power to the respective IC from a remote power supply; the apparatus further comprising:
   a plurality of voltage detectors, each coupled to a socket to sense the voltage of the power coupled to the respective IC; and
   a plurality of remote voltage regulators, each coupled between the power supply and a respective socket, to receive the sensed voltage from the respective voltage detector and to adjust the voltage of the respective coupled power in accordance therewith.

3. The apparatus of claim 2, wherein the burn-in board carries voltage detectors and conveys the sensed voltages toward the remote voltage regulators.

4. The apparatus of claim 3, further comprising a power distribution board, to receive the sensed voltages from the burn-in board and to carry the voltage regulators.

5. The apparatus of claim 4, wherein the power distribution board further comprises a power supply bus coupled to the voltage regulators and to the bulk power supply.

6. The apparatus of claim 2, wherein the voltage regulators comprise a plurality of voltage regulator controllers to receive the sensed voltage and generate a voltage control signals, the voltage regulators further comprising a plurality of voltage regulator modules, each voltage regulator controller controlling at least one voltage regulator module, the voltage regulator modules controlling the power supplied to a respective IC in response to a respective voltage control signal.

7. The apparatus of claim 1, wherein each analog to digital converter is coupled to a voltage sense pin of a respective one of the sockets.

8. The apparatus of claim 1, wherein each analog to digital converter is directly coupled to a Vcc pin of an IC and a Vss pin of the IC and wherein the analog-to-digital converter determines a difference between the Vec voltage and the Vss voltage.

9. The apparatus of claim 1, further comprising a second plurality of analog-to-digital converters coupled to the IC's to receive a measured temperature from the IC's and to convert the measured temperatures to a digital temperature value, and wherein the second communications bus is coupled to the temperature analog-to-digital converters to communicate the digital temperature values of each of the IC's to a temperature controller.

10. The apparatus of claim 1, wherein each temperature analog-to-digital converter is coupled to at least one temperature sense pin of a respective one of the sockets.

11. The apparatus of claim 1, further comprising a voltage regulator controller coupled to the first communications bus to receive the digital voltage values, coupled to the second communications bus to receive the digital temperature values, and coupled to the voltage regulator modules to control the voltage to be supplied to the IC's for burn-in.

12. An apparatus comprising:
a burn-in board;
a plurality of sockets on the burn-in board, each to hold an integrated circuit (IC) for test, each socket coupling power and communications to the respective IC;
a first communications bus on the burn-in board coupled to each socket to communicate test signals to the IC's;
a second communications bus on the burn-in board to communicate physical parameters of the IC's;
a power distribution board;
a plurality of voltage regulator modules on the power distribution board to supply power to each respective IC;
a plurality of voltage regulator controllers to provide a voltage control signal to the voltage regulator modules to control the power supplied to each respective IC; and
a voltage controller on the power distribution board to receive voltage measurements of each respective IC and to control the operation of the voltage regulator controllers.

13. The apparatus of claim 12, wherein the second communications bus is coupled to the voltage controller to communicate the voltage measurements of the IC's under test.

14. The apparatus of claim 13, wherein the second communications bus is further coupled to the voltage regulator controllers to allow the voltage controller to control the operation of the voltage regulator controllers.

15. The apparatus of claim 14, further comprising a plurality of voltage control lines on the power distribution board coupled between the voltage regulator controllers and at least one respective voltage regulator module to carry the voltage control signal.

16. The apparatus of claim 12, further comprising a temperature controller on the power distribution board coupled to a second communications bus to receive temperature measurements of each respective IC, and coupled to the first communications bus to communicate with the voltage controller.

17. The apparatus of claim 12, further comprising a plurality of voltage detectors each coupled to the second communications bus and to a respective IC socket to detect an IC voltage and transmit the detected voltage over the second communications bus to the voltage controller, a temperature controller, a third communications bus coupled to the temperature controller, and a plurality of temperature detectors, each coupled to the third communications bus and to a respective IC socket to detect an IC temperature and transmit the detected temperature over the third bus to the main controller.

18. The apparatus of claim 17, wherein the voltage controller and the temperature controller are coupled together using a network bus.

19. The apparatus of claim 12, further comprising a test driver on the power distribution board to drive tests of the IC's under test, wherein the test driver and the voltage controller are coupled together using a network bus.

20. An apparatus comprising:
a burn-in board;
a plurality of sockets on the burn-in board, each to hold an integrated circuit (IC) for test, each socket coupling power and communications to the respective IC, each socket further coupling power to the respective IC from a remote power supply;
a first communications bus on the burn-in board coupled to each socket to communicate test signals to the IC's;
a second communications bus on the burn-in board to communicate physical parameters of the IC's
a plurality of voltage detectors, each coupled to a socket to sense the voltage of the power coupled to the respective IC;
a plurality of remote voltage regulators, each coupled between the power supply and a respective socket, to receive the sensed voltage from the respective voltage detector and to adjust the voltage of the respective coupled power in accordance, the voltage regulators comprising a plurality of voltage regulator controllers to receive the sensed voltage and to generate voltage control signals, the voltage regulators further comprising a plurality of voltage regulator modules, each voltage regulator controller controlling at least one voltage regulator module, the voltage regulator modules controlling the power supplied to a respective IC in response to a respective voltage control signal.

21. The apparatus of claim 20, further comprising a power distribution board, to receive the sensed voltages from the burn-in board and to carry the voltage regulators, the apparatus further comprising a plurality of voltage regulator cards coupled to sockets on the power distribution board, each voltage regulator card carrying at least one voltage regulator module.

22. The apparatus of claim 21, further comprising a plurality of voltage regulator controller cards coupled to sockets on the power distribution board, each voltage regulator controller card carrying at least one voltage regulator controller.

23. The apparatus of claim 21, further comprising a main controller coupled to each voltage regulator controller to control the power supplied by each voltage regulator module to each IC socket.

24. The apparatus of claim 20, further comprising a voltage detector coupled to each IC socket to detect an IC voltage and to transmit the detected voltage to the main controller.

25. The apparatus of claim 20, further comprising a plurality of temperature detectors, each coupled to a socket to sense the temperature of the respective IC and wherein the voltage regulators adjust the voltage of the respective coupled power in accordance with the sensed temperature.

26. The apparatus of claim 20, wherein the voltage detectors are coupled to at least one voltage pin receiver of the socket to sense the respective IC voltage.

27. The apparatus of claim 26, wherein the voltage pin receivers correspond to a Vcc pin and a Vss pin.

28. The apparatus of claim 1, wherein the analog-to-digital converters transmit the digital voltage values on the bus in response to a polling signal from a voltage controller.

29. The apparatus of claim 1, further comprising a plurality of voltage regulator modules, each coupled to a respective one of the sockets to supply power to a respective one of the IC's.

30. The apparatus of claim 29, further comprising a voltage controller coupled to the communications bus to receive the digital voltage values and coupled to the voltage regulator modules to control the voltage of the power supplied to the IC's.

31. The apparatus of claim 20, further comprising a power supply pattern on the burn-in board having at least one conductor coupled to each socket to supply power to an IC coupled to each socket.

32. The apparatus of claim 31, further comprising a combined connector coupled to the power supply pattern lines and to the first and second communications buses to couple the power supply pattern lines and the first and second communication bus to external equipment.

33. The apparatus of claim 20, wherein the first communications bus is a voltage differential signaling bus coupled to each socket.

34. The apparatus of claim 20, further comprising an identification module on the burn-in board to carry an identification of the burn-in board.

35. An apparatus comprising:
a burn-in board;
a plurality of sockets on the burn-in board, each to hold an integrated circuit (IC) for test, each socket coupling power and communications to the respective IC;
a first communications bus on the burn-in board coupled to each socket to communicate test signals to the IC's;
a second communications bus on the burn-in board to communicate physical parameters of the IC's; and
a plurality of analog-to-digital converters, each to receive a physical parameter measurement of an IC, convert it to a digital value, and wherein the second communications bus is a digital bus coupled to the analog to digital converters.

36. The apparatus of claim 35, wherein the physical parameter measurement comprises an analog temperature signal.

37. The apparatus of claim 35, wherein the physical parameter measurement comprises an analog voltage signal.

38. An apparatus comprising:
a burn-in board;
a plurality of sockets on the burn-in board, each to hold an integrated circuit (IC) for test, each socket coupling power and communications to the respective IC;
a first communications bus on the burn-in board coupled to each socket to communicate test signals to the IC's;
a second communications bus on the burn-in board to communicate physical parameters of the IC's;
a test signal driver to communicate test signals with the IC's as low voltage signals;
an encoder to receive test signals from the test signal driver and to convert them to Voltage differential signals; and
a plurality of differential signal decoders to receive the voltage differential signals from the encoder, to decode them to, low voltage signals, and to supply them over the first communications bus to connection pins of a respective one of the IC's.

39. The apparatus of claim 38, further comprising a shared communication path to carry the voltage differential signals from the encoder to all of the decoders.

40. The apparatus of claim 38, further comprising a plurality of return paths to couple test outputs from each IC separately to the test signal driver.

41. The apparatus of claim 38, wherein the test signal driver is on a first substrate and the encoder and decoders are on a second substrate, the apparatus further comprising a signal connector to couple signals between the first substrate and the second substrate.

* * * * *